United States Patent
Hong

(10) Patent No.: US 11,327,112 B2
(45) Date of Patent: May 10, 2022

(54) SEMICONDUCTOR DEVICE FOR DETECTING CHARACTERISTICS OF SEMICONDUCTOR ELEMENT AND OPERATING METHOD THEREOF

(71) Applicant: SK hynix Inc., Gyeonggi-do (KR)

(72) Inventor: Yun Seok Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/146,892

(22) Filed: Jan. 12, 2021

(65) Prior Publication Data
US 2022/0057447 A1    Feb. 24, 2022

(30) Foreign Application Priority Data
Aug. 18, 2020    (KR) .......................... 10-2020-0103298

(51) Int. Cl.
*G01R 31/28* (2006.01)
*H01L 27/092* (2006.01)
*H01L 21/66* (2006.01)

(52) U.S. Cl.
CPC .......... *G01R 31/2884* (2013.01); *H01L 22/32* (2013.01); *H01L 27/092* (2013.01)

(58) Field of Classification Search
CPC .... G01R 31/2884; H01L 22/32; H01L 27/092

USPC ...................................... 324/750.3, 537, 500
See application file for complete search history.

(56) References Cited

U.S. PATENT DOCUMENTS

| | | | |
|---|---|---|---|
| 7,960,997 B2 | 6/2011 | Williams | |
| 10,218,352 B2* | 2/2019 | Fukuda | ............... H03K 19/0185 |
| 10,500,851 B2* | 12/2019 | Osuki | .................. B41J 2/14129 |
| 2014/0211560 A1* | 7/2014 | Hirata | .................... G11C 16/12 |
| | | | 365/185.2 |

FOREIGN PATENT DOCUMENTS

KR    10-2012-0045561    5/2012

* cited by examiner

*Primary Examiner* — Giovanni Astacio-Oquendo
(74) *Attorney, Agent, or Firm* — IP & T Group LLP

(57) ABSTRACT

According to an embodiment, a semiconductor device comprises a first monitoring pad and a second monitoring pad; a test circuit including an NMOS transistor having a drain and source coupled between a first voltage terminal and a common node, a PMOS transistor having a drain and source coupled between the common node and a second voltage terminal, a first switching element having a first terminal coupled to the common node via a first resistor and a second terminal coupled to the first monitoring pad, and a second switching element having a third terminal coupled to the common node via a second resistor and a fourth terminal coupled to the second monitoring pad; and a test control circuit suitable for controlling the test circuit.

21 Claims, 7 Drawing Sheets

SEMICONDUCTOR DEVICE FOR DETECTING CHARACTERISTICS OF SEMICONDUCTOR ELEMENT AND OPERATING METHOD THEREOF

CROSS-REFERENCE TO RELATED APPLICATION

The present application claims priority of Korean Patent Application No. 10-2020-0103298, filed on Aug. 18, 2020, which is herein incorporated by reference in its entirety.

BACKGROUND

1. Field

The disclosure relates to semiconductor design technology, and more specifically, to a semiconductor device for detecting operation current characteristics of transistors and an operating method thereof.

2. Description of the Related Art

Semiconductor devices are typically formed on silicon wafers. In general, several tens to hundreds of semiconductor devices are formed on one wafer. After multiple semiconductor devices are formed on a wafer, a test is conducted to determine whether each of the semiconductor devices on the wafer operates properly. Only wafers with properly operating semiconductor devices are packaged and shipped out.

Such a test is carried out using any of various methods. Electrical parameters are tested to determine whether the electrical characteristics of each unit element of each of the semiconductor devices correspond to target characteristics. Also tested is the functional aspect as to whether the semiconductor devices are operated as designed. In this test, it is determined whether signals are properly output in response to signals input to the semiconductor device.

To test electrical characteristics of a unit element, an operation current resulting from application of a constant voltage to the unit element, e.g., transistor or resistor, of the semiconductor device may be measured. However, it is not practical to apply a constant voltage to transistors and resistors arranged in various circuits. Currently, a test pattern/block including such elements as transistors or resistors implemented in the semiconductor device is prepared, a voltage is applied to the test block, and the resulting current is measured, thereby estimating the electrical parameters/characteristics of, e.g., transistors or resistors formed in the semiconductor devices.

SUMMARY

According to embodiments, there are provided a semiconductor device for detecting the characteristics of transistors with the internal environment of a chip reflected and an operating method thereof.

According to an embodiment, a semiconductor device comprises a first monitoring pad and a second monitoring pad; a test circuit including an NMOS transistor having a drain and source coupled between a first voltage terminal and a common node, a PMOS transistor having a drain and source coupled between the common node and a second voltage terminal, a first switching element having a first terminal coupled to the common node via a first resistor and a second terminal coupled to the first monitoring pad, and a second switching element having a third terminal coupled to the common node via a second resistor and a fourth terminal coupled to the second monitoring pad; and a test control circuit suitable for controlling the test circuit.

According to an embodiment, an operating method of a semiconductor device, including an NMOS transistor having a drain and source coupled between a first voltage terminal and a common node, a PMOS transistor having a drain and source coupled between the common node and a second voltage terminal, a first switching element having a first terminal coupled to a common node via a first resistor and a second terminal coupled to a first monitoring pad, and a second switching element having a third terminal coupled to the common node via a second resistor and a fourth terminal coupled to a second monitoring pad, comprises, in a first measurement mode, when a ground voltage is applied to the first monitoring pad, forming a first current path from the first voltage terminal to the first monitoring pad and then adjusting a drain-source voltage and gate-source voltage of the NMOS transistor; and in a second measurement mode, when a power source voltage is applied to the first monitoring pad, forming a second current path from the first monitoring pad to the second voltage terminal and then adjusting a drain-source voltage and gate-source voltage of the PMOS transistor.

According to an embodiment, a method for measuring a saturation current of each transistor via a first monitoring pad and a second monitoring pad coupled to a common node of an NMOS transistor and a PMOS transistor of a semiconductor device comprises forming a first current path between the NMOS transistor and the first monitoring pad by applying a ground voltage to the first monitoring pad; measuring a first current flowing through the first monitoring pad; generating a detection signal by detecting a voltage of the common node via the second monitoring pad and providing the detection signal to the semiconductor device; measuring a second current via the first monitoring pad; and calculating a saturation current of the NMOS transistor based on the first current and the second current.

According to an embodiment, a semiconductor device comprises a test circuit including: a transistor operatively coupled between a terminal and a node, a first pad operatively coupled to the node via a resistor, and a second pad operatively coupled to the node; and a control circuit suitable for controlling the test circuit to: form a current path between the terminal and the first pad to generate a first current on the current path and a voltage on the node, and generate a second current on the current path by adjusting, based on the voltage on the node, a drain-source voltage and a gate-source voltage of the transistor, wherein a source and a bulk of the transistor is coupled to the node, wherein the first and second currents are respectively detectable at the first pad and utilized to calculate a saturation current of the transistor, and wherein the voltage on the node is detectable at the second pad.

According to the embodiments, in the semiconductor device, transistor characteristics may be accurately detected. Thus, it is possible to enhance the characteristics of the semiconductor device manufactured.

According to the embodiments, in the semiconductor device, transistor characteristics may be accurately detected. Thus, it is possible to reduce malfunctions even when the semiconductor device operates at high speed.

DETAILED DESCRIPTION

Figure 1:
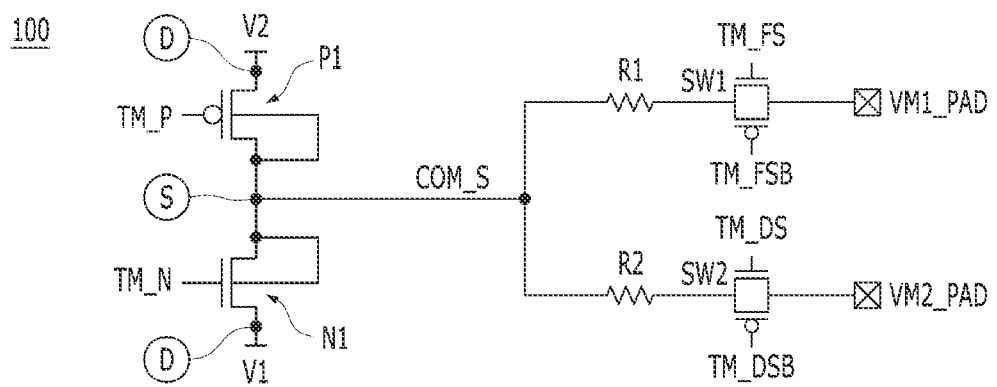
FIG. 1 is a circuit diagram illustrating a test circuit according to an embodiment.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. It is noted that reference to "an embodiment," "another embodiment" or the like does not necessarily mean only one embodiment, and different references to any such phrase are not necessarily to the same embodiment(s). The term "embodiments" when used herein does not necessarily refer to all embodiments.

It will be understood that, although the terms "first", "second", "third", and so on may be used herein to identify various elements, these elements are not limited by these terms. These terms are used to distinguish one element from another element that otherwise have the same or similar names. Thus, a first element in one instance could also be termed a second or third element in another instance without indicating any change in the element itself.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

To measure the operation current (IOP) of a transistor, there has been proposed a method that measures the current flowing through a data pad connected with the transistor. However, as the data input/output operation is performed at higher speed, the loading of the data pad increases due to the transistor connected with the data pad. Another method is to measure the operation current (IOP) flowing through a separate voltage measuring pad connected with the transistor, using a Kelvin contact probe. The Kelvin contact probe has a force probe for supplying current and a sense probe for detecting voltage. The two probes are insulated from each other and may be brought in contact with the external terminals of the semiconductor device. However, when measuring current using the Kelvin contact probe, the force probe applies a voltage not higher than the ground voltage (VSS) which causes leakage to occur, rendering accurate measurement difficult.

According to an embodiment, a new and improved method for measuring the operation current is provided.

FIG. 1 is a circuit diagram illustrating a test circuit 100 according to an embodiment.

Referring to FIG. 1, the test circuit 100 may include a N-channel metal oxide semiconductor transistor (NMOS) N1 having a drain and source connected between a first voltage terminal V1 and a common node COM_S, a P-channel metal oxide semiconductor transistor (PMOS) P1 having a drain and source connected between the common node COM_S and a second voltage terminal V2, a first switching element SW1 having a first terminal connected with the common node COM_S via a first resistor R1 and a second terminal connected with a first monitoring pad VM1_PAD, and a second switching element SW2 having a first terminal connected with the common node COM_S via a second resistor R2 and a second terminal connected with a second monitoring pad VM2_PAD. For example, the first resistor R1 and the second resistor R2 may be parasitic line resistors in the metal lines.

Specifically, the drain of the NMOS transistor N1 may be connected to the first voltage terminal V1, and the source of the NMOS transistor N1 may be connected to the common node COM_S. A first control signal TM_N may be received via the gate of the NMOS transistor N1. The drain of the PMOS transistor P1 may be connected to the second voltage terminal V2, and the source of the PMOS transistor P1 may be connected to the common node COM_S. A second control signal TM_P may be received via the gate of the PMOS transistor P1. According to an embodiment, the bulk and source of the NMOS transistor N1 and the bulk and source of the PMOS transistor P1 may be connected with the common node COM_S. Thus, the bulk-source voltage becomes substantially 0V, preventing unstable variations in the threshold voltage of the MOS transistor due to the body effect. Thus, it is possible to precisely monitor the transistor characteristics.

The first switching element SW1 may be turned on by a third control signal TM_FS and an inverted third control signal TM_FSB. The second switching element SW2 may be turned on by a fourth control signal TM_DS and an inverted fourth control signal TM_DSB. The first switching element SW1 and the second switching element SW2 each may be implemented as a transmission gate.

According to an embodiment, the first monitoring pad VM1_PAD and the second monitoring pad VM2_PAD may be implemented as a monitoring-dedicated pad, which is different than the data pad DQ, and may include, e.g., a voltage measuring pad. In other words, the first monitoring pad VM1_PAD and the second monitoring pad VM2_PAD may be controlled to be floated or to have a fixed voltage level and thus not to operate in a non-measurement mode, e.g., in a data input/output operation.

Figure 2:
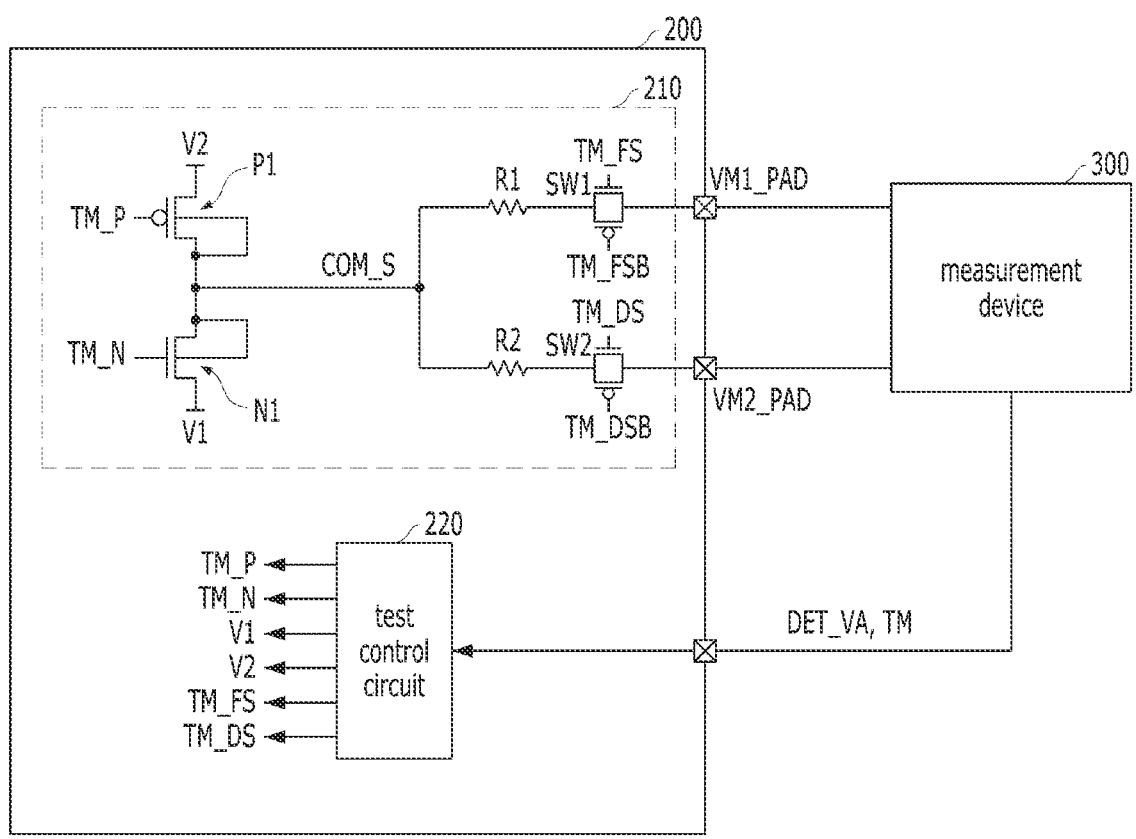
FIG. 2 is a block diagram illustrating a semiconductor system including a semiconductor device and a current measurement device according to an embodiment.

FIG. 2 is a block diagram illustrating a semiconductor system including a semiconductor device 200 and a current measurement device 300 according to an embodiment. FIG.

3 is a diagram illustrating a state of a test circuit 210 in a non-measurement mode as shown in FIG. 1.

Referring to FIG. 2, the semiconductor device 200 may include a first monitoring pad VM1_PAD, a second monitoring pad VM2_PAD, the test circuit 210, and a test control circuit 220.

The first monitoring pad VM1_PAD, the second monitoring pad VM2_PAD, and the test circuit 210 are substantially similar to the first monitoring pad VM1_PAD, the second monitoring pad VM2_PAD, and the test circuit 100, respectively, of FIG. 1, and thus are not described again.

The test control circuit 220 may generate a first to fourth control signal TM_N, TM_P, TM_FS, and TM_DS according to a test mode signal TM and detection signal DET_VA provided from the measurement device 300 and adjust the voltage levels provided to the first voltage terminal V1 and second voltage terminal V2, thereby controlling the test circuit 210. The detection signal DET_VA and the test mode signal TM may be input to the test control circuit 220 through command/address pads or data pads other than the first monitoring pad VM1_PAD and the second monitoring pad VM2_PAD. The test control circuit 220 may generate an inverted third and fourth control signal TM_FSB and TM_DSB by inverting the third and fourth control signals TM_FS and TM_DS.

Specifically, the test control circuit 220 may control the test circuit 210 to operate in a non-measurement mode or measurement mode according to the test mode signal TM.

Figures 3, 4:
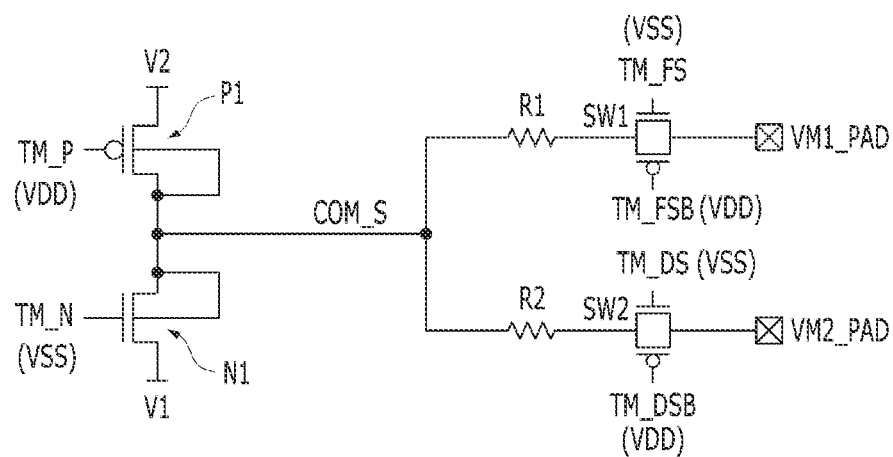
FIG. 3 is a diagram illustrating a state of a test circuit in a non-measurement mode as shown in FIG. 1.
FIGS. 4, 5A, and 5B are diagrams illustrating a method for measuring a saturation current of an NMOS transistor in a first measurement mode.

Referring to FIG. 3, in the non-measurement mode, the test control circuit 220 may generate the first control signal TM_N at a logic low level (e.g., ground voltage (VSS) level), the second control signal TM_P at a logic high level (e.g., power source voltage (VDD) level), and the third and fourth control signals TM_FS and TM_DS at the logic low level, according to the test mode signal TM. Thus, the NMOS transistor N1, the PMOS transistor P1, the first switching element SW1, and the second switching element SW2 all may be turned off, floating the first monitoring pad VM1_PAD and the second monitoring pad VM2_PAD. In this case, as the NMOS transistor N1, the PMOS transistor P1, the first switching element SW1, and the second switching element SW2 all are turned off, leakage may be prevented. According to an embodiment, in the non-measurement mode, the test control circuit 220 may generate the first and second control signals TM_N and TM_P at the logic low level and the third and fourth control signals TM_FS and TM_DS at the logic high level according to the test mode signal TM and drive the second voltage terminal V2 at the ground voltage (VSS) level. Thus, the NMOS transistor N1 is turned off, and all of the PMOS transistor P1, the first switching element SW1, and the second switching element SW2 are turned on, so that the first monitoring pad VM1_PAD and the second monitoring pad VM2_PAD may have a fixed voltage level (e.g., the ground voltage level). As described above, in the non-measurement mode, such as data input/output operation, the test control circuit 220 may float the first monitoring pad VM1_PAD and the second monitoring pad VM2_PAD or fix the voltage level of the first monitoring pad VM1_PAD and the second monitoring pad VM2_PAD, thereby allowing for control without influencing the operation of the data pad DQ which performs data input/output operation.

Referring back to FIG. 2, in the measurement mode, the test control circuit 220 may control the test circuit 210 to form a current path between the first monitoring pad VM1_PAD and the NMOS transistor N1 or the PMOS transistor P1, one of which is selected as a target transistor, according to the test mode signal TM to test the characteristics thereof. The measurement mode may include a first measurement mode for the characteristics (e.g., saturation current) of the NMOS transistor and a second measurement mode for measuring the characteristics (e.g., saturation current) of the PMOS transistor. For example, in the first measurement mode, the test control circuit 220 may control the test circuit 210 to form a current path between the NMOS transistor N1 and the first monitoring pad VM1_PAD and, in the second measurement mode, the test control circuit 220 may control the test circuit 210 to form a current path between the PMOS transistor P1 and the first monitoring pad VM1_PAD. In the first and second measurement modes, the test control circuit 220 may adjust the drain-source voltages and gate-source voltages of the NMOS and PMOS transistors, respectively, according to the detection signal DET_VA.

The measurement device 300 may generate the test mode signal TM to distinguish the non-measurement mode, the first measurement mode, and the second measurement mode from one another. For example, the test mode signal TM may be a two-bit signal of "00" in the non-measurement mode, "01" in the first measurement mode, and "10" in the second measurement mode. In the measurement mode, the measurement device 300 may measure the saturation current of the NMOS transistor N1 and PMOS transistor P1 of the semiconductor device 200 using the first monitoring pad VM1_PAD and the second monitoring pad VM2_PAD. In the measurement mode, the measurement device 300 may apply a fixed voltage level to the first monitoring pad VM1_PAD and measure a first current flowing through the first monitoring pad VM1_PAD, with a current path formed between the target transistor and the first monitoring pad VM1_PAD. The measurement device 300 may detect the voltage VA of the common node COM_S via the second monitoring pad VM2_PAD. Based on the detected voltage level VA, the measurement device 300 may provide a detection signal DET_VA to the semiconductor device 200 or adjust the voltage level of the first monitoring pad VM1_PAD. Thereafter, as the drain-source voltage and gate-source voltage of the target transistor are adjusted, the measurement device 300 may measure the second current via the first monitoring pad VM1_PAD. The measurement device 300 may calculate the saturation current of the target transistor based on the first current and second current. For example, with either the NMOS transistor N1 alone or the PMOS transistor P1 alone selected as the target transistor, the measurement device 300 may calculate the saturation current of the target transistor using the first and second currents measured via the first monitoring pad VM1_PAD while varying the state of the target transistor.

The measurement device 300 may calculate the operation current IOP based on the saturation current of the NMOS transistor N1 and the PMOS transistor P1. For example, the measurement device 300 may calculate the operation current IOP using the following equation. Thus, according to an embodiment, the element (or device) characteristics may be tested by calculating the operation current IOP based on the saturation current of each transistor.

[Equation 1]
IOP=NMOS Idsat+k*PMOS Idsat, where 'NMOS Idsat' is the saturation current of the NMOS transistor, 'PMOS Idsat' is the saturation current of the PMOS transistor, and 'k' is the PN-ratio.

Described below are the operations of the test control circuit 220 and measurement device 300 in the first measurement mode and second measurement mode based on the state of each component of the test circuit 210, with reference to the drawings.

Figure 5A:
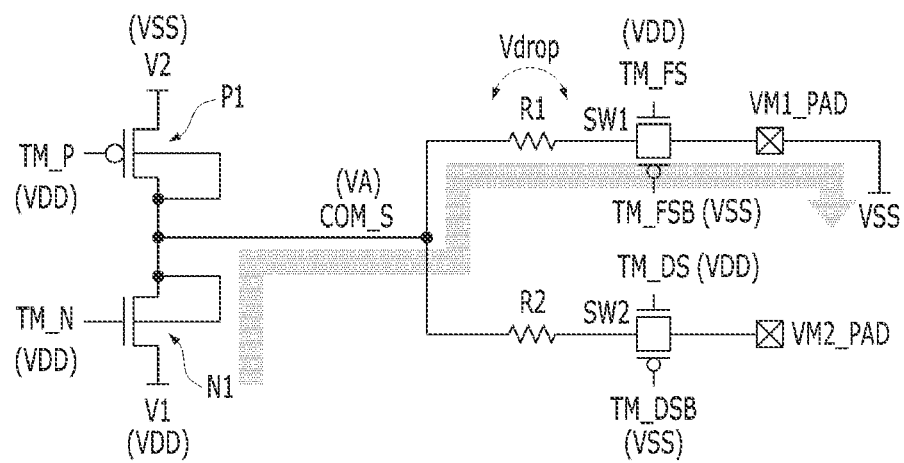
Figure 5B:
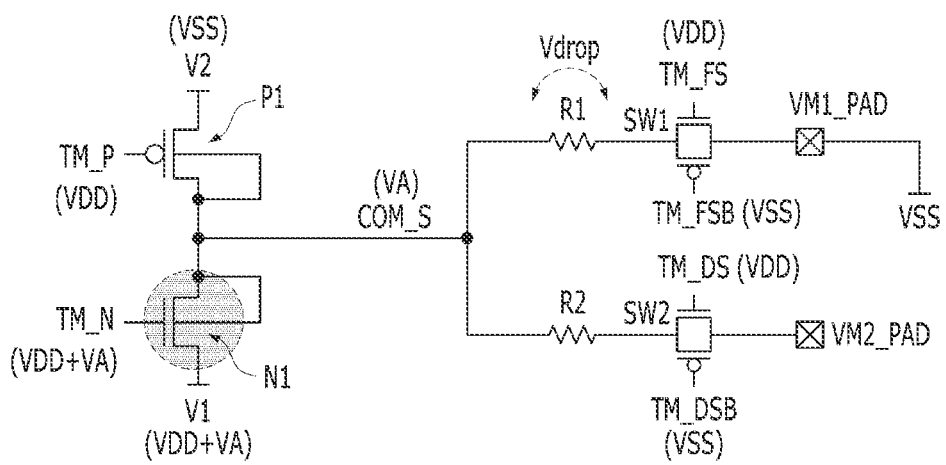

FIGS. 4, 5A, and 5B are diagrams illustrating a method for measuring a saturation current of an NMOS transistor N1 in a first measurement mode.

Referring to FIGS. 4 and 5A, in the first measurement mode, the measurement device 300 may apply a ground voltage VSS to the first monitoring pad VM1_PAD. The test control circuit 220 may generate the third and fourth control signals TM_FS and TM_DS at the logic high level (e.g., the power source voltage (VDD) level) according to the test mode signal TM and apply the power source voltage VDD to the first voltage terminal V1 and the ground voltage VSS to the second voltage terminal V2. Accordingly, the PMOS transistor P1 is turned off, and all of the NMOS transistor N1, the first switching element SW1, and the second switching element SW2 are turned on. Resultantly, a first current path may be formed from the first voltage terminal V1 through the NMOS transistor N1 and common node COM_S to the first monitoring pad VM1_PAD. In this case, the drain-source voltage VDS and the gate-source voltage VGS of the NMOS transistor N1 both become the (VDD-VA) level so that the NMOS transistor N1 may be in the saturated state.

With the first current path formed, the measurement device 300 may measure the first current flowing through the first monitoring pad VM1_PAD. The measurement device 300 may detect the voltage VA of the common node COM_S via the second monitoring pad VM2_PAD. In this case, under the assumption that the voltage between the terminals of the first resistor R1 is the voltage drop (Vdrop), the voltage VA of the common node COM_S may be at the same level, i.e., Vdrop. The measurement device 300 may provide a detection signal DET_VA generated using the detected voltage level to the semiconductor device 200.

Referring to FIGS. 4 and 5B, the test control circuit 220 may adjust the voltage level of the first voltage terminal V1 and the voltage level of the first control signal TM_N according to the detection signal DET_VA. For example, the test control circuit 220 may adjust each of the voltage level of the first voltage terminal V1 and the first control signal TM_N to the sum (VDD+VA) of the power source voltage VDD and the voltage VA of the common node COM_S determined according to the detection signal DET_VA. Thus, each of the drain-source voltage VDS and the gate-source voltage VGS of the NMOS transistor N1 becomes the power source voltage VDD level. In this case, the NMOS transistor N1 may still remain in the saturated state.

The measurement device 300 may measure the second current via the first monitoring pad VM1_PAD. The measurement device 300 may calculate the saturation current of the NMOS transistor N1 based on the first current and the second current. For example, under the assumption that the power source voltage VDD level is 1.05V, and the voltage drop Vdrop level is 0.1V, the first current is the drain saturation current when the drain-source voltage VDS and the gate-source voltage VGS of the NMOS transistor N1 both are 0.95V, and the second current is the drain saturation current when the drain-source voltage VDS and the gate-source voltage VGS of the NMOS transistor N1 both are 1.05V. Therefore, with the NMOS transistor N1 alone selected, the measurement device 300 may accurately calculate the saturation current of the NMOS transistor N1 using the first and second currents measured via the first monitoring pad VM1_PAD while varying the state of the NMOS transistor N1.

In the embodiment described above, the measurement device 300 provides the detection signal DET_VA corresponding to the voltage VA of the common node COM_S and, based thereupon, the test control circuit 220 adjusts the voltage level of the first control signal TM_N and the voltage level of the first voltage terminal V1. However, the present invention is not limited thereto. According to another embodiment, the measurement device 300 may adjust the power source voltage level of the test circuit 210 to the (VDD+VA) level, which has been elevated by the voltage VA of the common node COM_S, based on the voltage VA of the common node COM_S, i.e., according to the detection signal DET_VA. In other words, as denoted by the dashed line of FIG. 4, the first to fourth control signals TM_N, TM_P, TM_FS, and TM_DS and the first voltage terminal V1 all may be driven at the (VDD+VA) level.

Figure 6:
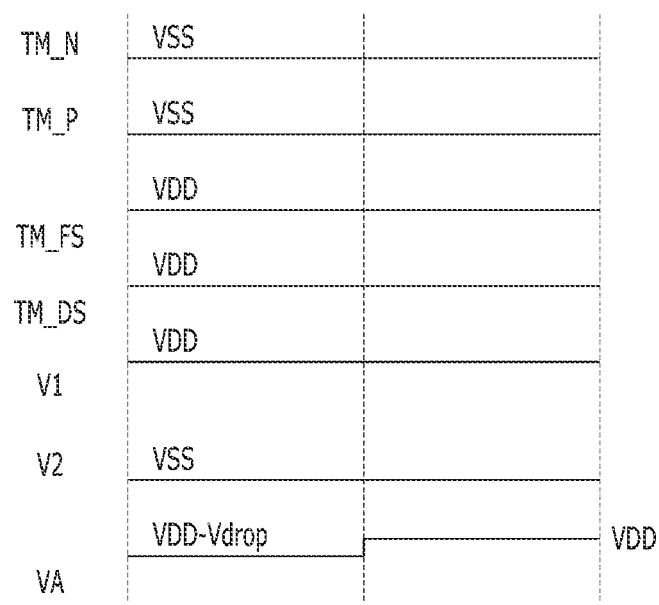
FIGS. 6, 7A, and 7B are diagrams illustrating a method for measuring a saturation current of a PMOS transistor in a second measurement mode.
Figure 7A:
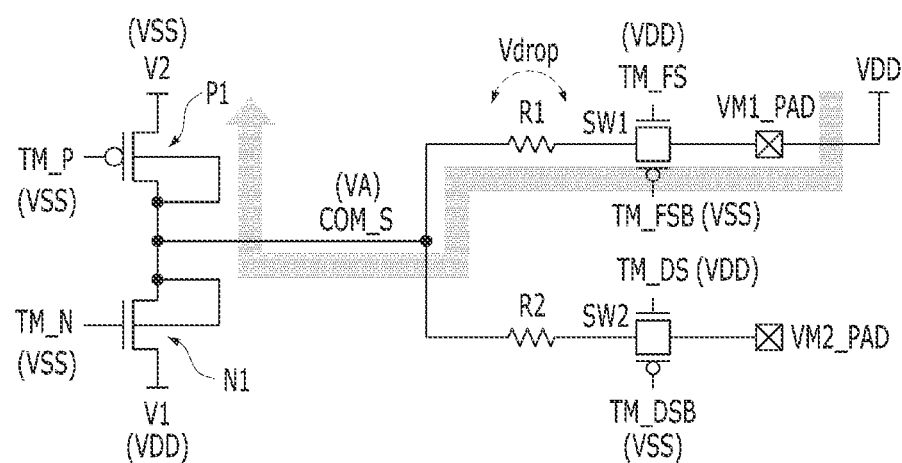
Figure 7B:
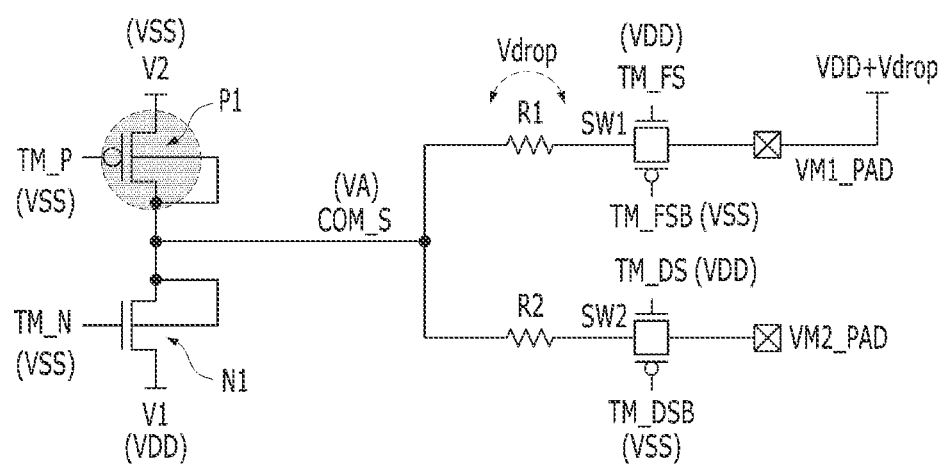

FIGS. 6, 7A, and 7B are diagrams illustrating a method for measuring a saturation current of a PMOS transistor P1 in a second measurement mode.

Referring to FIGS. 6 and 7A, in the second measurement mode, the measurement device 300 may apply a power source voltage VDD to the first monitoring pad VM1_PAD. The test control circuit 220 may generate the first and second control signals TM_N and TM_P at the logic low level and the third and fourth control signals TM_FS and TM_DS at the logic high level according to the test mode signal TM and apply the ground voltage VSS level to the second voltage terminal V2. Accordingly, the NMOS transistor N1 is turned off, and all of the PMOS transistor P1, the first switching element SW1, and the second switching element SW2 are turned on. Resultantly, a second current path may be formed from the first monitoring pad VM1_PAD through the common node COM_S and the PMOS transistor P1 to the second voltage terminal V2. In this case, the drain-source voltage VDS and the gate-source voltage VGS of the PMOS transistor P1 both become the voltage level VA of the common node COM_S so that the PMOS transistor P1 may be in the saturated state.

With the second current path formed, the measurement device 300 may measure the third current flowing through the first monitoring pad VM1_PAD. The measurement device 300 may detect the voltage VA of the common node COM_S via the second monitoring pad VM2_PAD. In this case, under the assumption that the voltage between the terminals of the first resistor R1 is the voltage drop Vdrop, the voltage VA of the common node COM_S may be at the VDD-Vdrop level, which is the power source voltage VDD level less the voltage drop Vdrop.

Referring to FIGS. 6 and 7B, the measurement device 300 may adjust the voltage level of the first monitoring pad VM1_PAD using the detected voltage VA level. The measurement device 300 may calculate the Vdrop level between the terminals of the first resistor R1 using the detected voltage VA level and adjust the voltage level of the first monitoring pad VM1_PAD to the sum (VDD+Vdrop) of the power source voltage and the voltage Vdrop between the terminals of the first resistor. For example, the measurement device 300 may yield the voltage level Vdrop, which is the voltage between the terminals of the first resistor R1, by calculating the difference (i.e., Vdrop) between the power source voltage VDD level and the detected voltage level (VDD-Vdrop) and adjust the voltage level of the first monitoring pad VM1_PAD to the sum (VDD+Vdrop) of the yielded voltage level Vdrop and the power source voltage VDD. Thus, the voltage VA of the common node COM_S becomes the power source voltage VDD level, and each of the drain-source voltage VDS and the gate-source voltage VGS of the PMOS transistor P1 becomes the power source voltage VDD level. In this case, the PMOS transistor P1 may still remain in the saturated state.

The measurement device 300 may measure the fourth current via the first monitoring pad VM1_PAD. The measurement device 300 may calculate the saturation current of the PMOS transistor P1 based on the third current and the fourth current. For example, under the assumption that the power source voltage VDD level is 1.05V, and the voltage drop Vdrop level is 0.1V, the third current is the drain saturation current when the drain-source voltage VDS and the gate-source voltage VGS of the PMOS transistor P1 both are 0.95V, and the fourth current is the drain saturation current when the drain-source voltage VDS and the gate-source voltage VGS of the PMOS transistor P1 both are 1.05V. Therefore, with the PMOS transistor P1 alone selected, the measurement device 300 may calculate the saturation current of the PMOS transistor P1 using the third and fourth currents measured via the first monitoring pad VM1_PAD while changing the state of the PMOS transistor P1.

Figure 8:
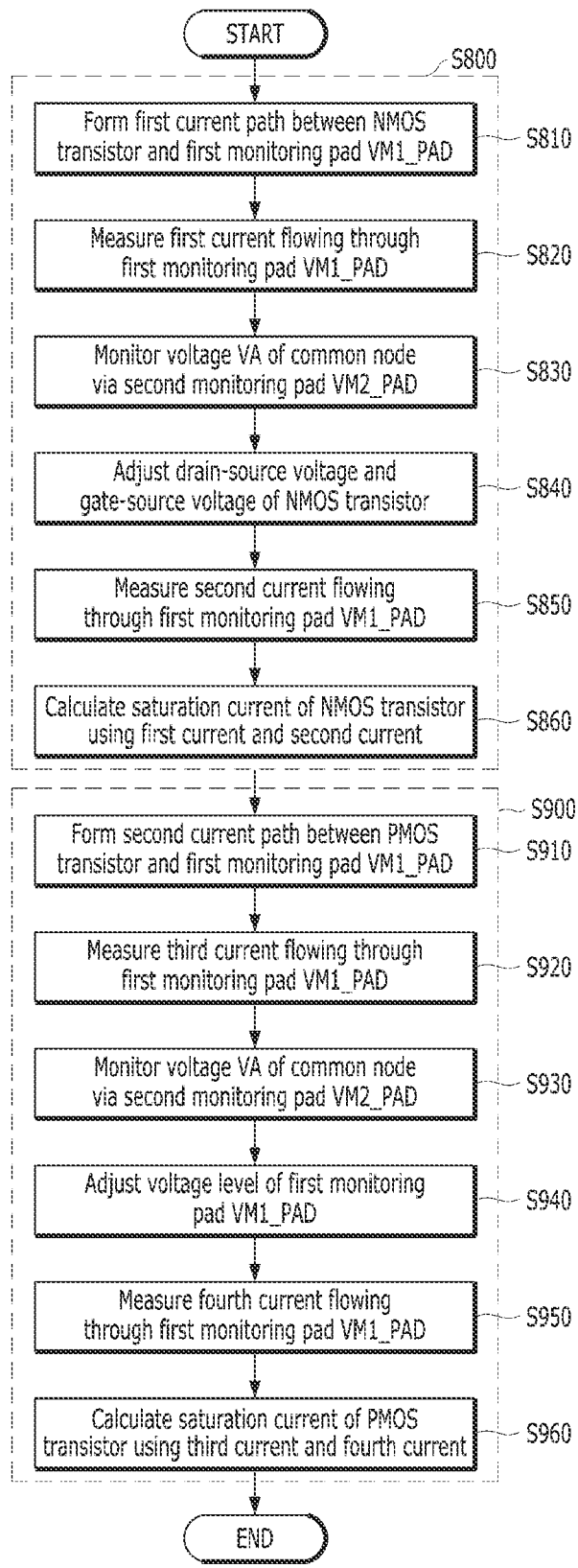
FIG. 8 is a flowchart illustrating a current measurement method according to an embodiment.

FIG. 8 is a flowchart illustrating a current measurement method according to an embodiment.

Referring to FIG. 8, the measurement device 300 transfers a test mode signal TM for entering the non-measurement mode, the first measurement mode, or the second measurement mode to the test control circuit 220.

Where the test mode signal TM for indicating the non-measurement mode is transferred, for example, in a data input/output operation, the first monitoring pad VM1_PAD and the second monitoring pad VM2_PAD may be controlled to be floated or to have a fixed voltage level so as not to operate.

First, in the first measurement mode (at S800), the measurement device 300 applies the ground voltage VSS level to the first monitoring pad VM1_PAD. According to the test mode signal TM indicating the first measurement mode, the test control circuit 220 controls the test circuit 210 to form a first current path between the NMOS transistor N1 and the first monitoring pad VM1_PAD (at S810).

With the first current path formed, the measurement device 300 measures the first current flowing through the first monitoring pad VM1_PAD, as the drain saturation current of the NMOS transistor N1 (at S820). The measurement device 300 detects the voltage VA of the common node COM_S via the second monitoring pad VM2_PAD and provides a detection signal DET_VA generated using the detected voltage VA level to the semiconductor device 200 (at S830).

The test control circuit 220 may adjust the voltage level of the first voltage terminal V1 and the first control signal TM_N to the sum (VDD+VA) of the power source voltage VDD and the voltage VA of the common node COM_S determined according to the detection signal DET_VA. According to an embodiment, the measurement device 300 may adjust the power source voltage level of the test circuit 210 to the (VDD+VA) level based on the voltage VA of the common node COM_S. Thus, each of the drain-source voltage VDS and the gate-source voltage VGS of the NMOS transistor N1 may be adjusted to become the power source voltage VDD level (at S840).

The measurement device 300 measures the second current flowing through the first monitoring pad VM1_PAD, as the drain saturation current of the NMOS transistor N1 (at S850). The measurement device 300 may calculate the saturation current of the NMOS transistor N1 based on the first current and the second current (at S860).

Thereafter, the second measurement mode may be performed (at S900).

The measurement device 300 applies the power source voltage VDD level to the first monitoring pad VM1_PAD. According to the test mode signal TM indicating the second measurement mode, the test control circuit 220 controls the test circuit 210 to form a second current path between the PMOS transistor P1 and the first monitoring pad VM1_PAD (at S910).

With the second current path formed, the measurement device 300 measures the third current flowing through the first monitoring pad VM1_PAD, as the drain saturation current of the PMOS transistor P1 (at S920). The measurement device 300 detects the voltage VA of the common node COM_S via the second monitoring pad VM2_PAD (at S930), and adjusts the voltage level of the first monitoring pad VM1_PAD using the detected voltage VA level (at S940). Thus, the voltage VA of the common node COM_S becomes the power source voltage VDD level, and each of the drain-source voltage VDS and the gate-source voltage VGS of the PMOS transistor P1 may be adjusted to become the power source voltage VDD level.

The measurement device 300 measures the fourth current flowing through the first monitoring pad VM1_PAD, as the drain saturation current of the PMOS transistor P1 (at S950). The measurement device 300 may calculate the saturation current of the PMOS transistor P1 based on the third current and the fourth current (at S960).

Thereafter, the measurement device 300 may calculate the operation current IOP based on the saturation current of the NMOS transistor N1 and the PMOS transistor P1.

Although in the above-described embodiments, the saturation current of the PMOS transistor P1 is measured after the saturation current of the NMOS transistor N1 is measured, the present invention is not limited thereto. For example, after the saturation current of the PMOS transistor P1 is measured, the saturation current of the NMOS transistor N1 may be measured.

As set forth above, according to the disclosed embodiments, in the semiconductor device, current is measured using the test circuit inside the chip, allowing the transistor characteristics to be detected, with the internal environment of the chip reflected. Further, current may be measured in a scheme in which the applied voltage level need not be lower than the ground voltage. Thus, it is possible to accurately detect the transistor characteristics without current leakage.

It should be noted that although embodiments of the present invention have been illustrated and described, the present invention is not limited to or by any of the disclosed embodiments. Those skilled in the art will recognize in light of the present disclosure that various changes may be made to any of the disclosed embodiments without departing from the technical spirit of the present invention. The present invention encompasses all changes that fall within the scope of the claims.

For example, the logic gates and transistors provided as examples herein, may be of a different type and arranged differently than disclosed herein depending on the polarity of the input signal.

What is claimed is:

1. A semiconductor device, comprising:
   a first monitoring pad and a second monitoring pad;
   a test circuit including a n-channel metal-oxide semiconductor (NMOS) transistor having a drain and source coupled between a first voltage terminal and a common node, a p-channel metal-oxide semiconductor (PMOS) transistor having a drain and source coupled between the common node and a second voltage terminal, a first switching element having a first terminal coupled to the common node via a first resistor and a second terminal coupled to the first monitoring pad, and a second switching element having a third terminal coupled to the common node via a second resistor and a fourth terminal coupled to the second monitoring pad; and a test control circuit suitable for controlling the test circuit.

2. The semiconductor device of claim 1, wherein in a data input/output operation, the test control circuit turns off all of the NMOS transistor, the PMOS transistor, the first switching element, and the second switching element to float the first monitoring pad and the second monitoring pad.

3. The semiconductor device of claim 1, wherein in a first measurement mode, when a ground voltage level is applied to the first monitoring pad, the test control circuit forms a first current path from the first voltage terminal to the first monitoring pad and then adjusts a drain-source voltage and gate-source voltage of the NMOS transistor.

4. The semiconductor device of claim 3, wherein the test control circuit supplies a power source voltage to the first voltage terminal and turns on the NMOS transistor, the first switching element, and the second switching element to form the first current path.

5. The semiconductor device of claim 3, wherein the test control circuit adjusts a voltage level of a gate of the NMOS transistor and the first voltage terminal to be a sum of a voltage of the common node and the power source voltage to adjust the drain-source voltage and gate-source voltage of the NMOS transistor.

6. The semiconductor device of claim 1, wherein in a second measurement mode, when a power source voltage level is applied to the first monitoring pad, the test control circuit forms a second current path from the first monitoring pad to the second voltage terminal and then adjusts a drain-source voltage and gate-source voltage of the PMOS transistor.

7. The semiconductor device of claim 6, wherein the test control circuit supplies a ground voltage to the second voltage terminal and turns on the PMOS transistor, the first switching element, and the second switching element to form the second current path.

8. The semiconductor device of claim 6, wherein a voltage level of the first monitoring pad is adjusted to be a sum of a voltage between both terminals of the first resistor, and the power source voltage to adjust the drain-source voltage and gate-source voltage of the PMOS transistor.

9. The semiconductor device of claim 1, wherein the source and bulk of the NMOS transistor and the source and bulk of the PMOS transistor are coupled to the common node.

10. An operating method of a semiconductor device including an n-channel metal-oxide semiconductor (NMOS) transistor having a drain and source coupled between a first voltage terminal and common node, a p-channel metal-oxide semiconductor (PMOS) transistor having a drain and source coupled between the common node and a second voltage terminal, a first switching element having a first terminal coupled to a common node via a first resistor and a second terminal coupled to a first monitoring pad, and a second switching element having a third terminal coupled to the common node via a second resistor and a fourth terminal coupled to a second monitoring pad, the operating method comprising:

in a first measurement mode, when a ground voltage is applied to the first monitoring pad, forming a first current path from the first voltage terminal to the first monitoring pad and then adjusting a drain-source voltage and gate-source voltage of the NMOS transistor; and in a second measurement mode, when a power source voltage is applied to the first monitoring pad, forming a second current path from the first monitoring pad to the second voltage terminal and then adjusting a drain-source voltage and gate-source voltage of the PMOS transistor.

11. The operating method of claim 10, further comprising, in a data input/output operation, turning off all of the PMOS transistor, the NMOS transistor, the first switching element, and the second switching element to float the first monitoring pad and the second monitoring pad.

12. The operating method of claim 10, wherein the forming of the first current path includes:

supplying the power source voltage to the first voltage terminal, and turning on the NMOS transistor, the first switching element, and the second switching element.

13. The operating method of claim 10, wherein the adjusting of the drain-source voltage and gate-source voltage of the NMOS transistor includes:

adjusting a voltage level of the first voltage terminal to be a sum of a voltage of the common node and the power source voltage.

14. The operating method of claim 10, wherein the forming of the second current path includes:

supplying a ground voltage to the second voltage terminal, and turning on the PMOS transistor, the first switching element, and the second switching element.

15. The operating method of claim 10, wherein a voltage level of the first monitoring pad is adjusted to be a sum of a voltage between both terminals of the first resistor, and the power source voltage to adjust the drain-source voltage and gate-source voltage of the PMOS transistor.

16. A method for measuring a saturation current of each transistor via a first monitoring pad and a second monitoring pad coupled to a common node of an n-channel metal-oxide semiconductor (NMOS) transistor and a p-channel metal-oxide semiconductor (PMOS) transistor of a semiconductor device, the method comprising:

forming a first current path between the NMOS transistor and the first monitoring pad by applying a ground voltage to the first monitoring pad;

measuring a first current flowing through the first monitoring pad;

generating a detection signal by detecting a voltage of the common node via the second monitoring pad and providing the detection signal to the semiconductor device;

measuring a second current via the first monitoring pad; and calculating a saturation current of the NMOS transistor based on the first current and the second current.

17. The method of claim 16, further comprising increasing a power source voltage of the semiconductor device to the voltage of the common node according to the detection signal.

18. The method of claim 16, further comprising:

forming a current path between the first monitoring pad and the PMOS transistor by applying a power source voltage to the first monitoring pad;

measuring a third current flowing through the first monitoring pad;

detecting the voltage of the common node via the second monitoring pad and adjusting the voltage level of the first monitoring pad using the detected voltage;

measuring a fourth current via the first monitoring pad; and calculating a saturation current of the PMOS transistor based on the third current and the fourth current.

19. The method of claim 18, wherein the voltage level of the first monitoring pad is adjusted to be a sum of the power source voltage level and a difference between the detected voltage level and the power source voltage level.

20. The method of claim 16, further comprising calculating an operation current based on the saturation currents of the NMOS transistor and the PMOS transistor.

21. A semiconductor device comprising:
a test circuit including:
a transistor operatively coupled between a terminal and a node,
a first pad operatively coupled to the node via a resistor, and
a second pad operatively coupled to the node; and
a control circuit suitable for controlling the test circuit to:
form a current path between the terminal and the first pad to generate a first current on the current path and a voltage on the node, and
generate a second current on the current path by adjusting, based on the voltage on the node, a drain-source voltage and a gate-source voltage of the transistor,
wherein a source and a bulk of the transistor is coupled to the node,
wherein the first and second currents are respectively detectable at the first pad and utilized to calculate a saturation current of the transistor, and
wherein the voltage on the node is detectable at the second pad.

* * * * *